(12) United States Patent
Divvela et al.

(10) Patent No.: US 12,401,350 B1
(45) Date of Patent: Aug. 26, 2025

(54) DYNAMIC POWER EFFICIENT LOW POWER FLIP-FLOP

(71) Applicant: Synopsys, Inc., Sunnyvale, CA (US)

(72) Inventors: Sai Yaswanth Divvela, Guntur (IN); Amit Verma, Hyderabad (IN); Basannagouda Somanath Reddy, San Jose, CA (US)

(73) Assignee: Synopsys, Inc., Sunnyvale, CA (US)

(*) Notice: Subject to any disclaimer, the term of this patent is extended or adjusted under 35 U.S.C. 154(b) by 76 days.

(21) Appl. No.: 18/459,931

(22) Filed: Sep. 1, 2023

(51) Int. Cl.
*H03K 3/356* (2006.01)
*H03K 3/012* (2006.01)

(52) U.S. Cl.
CPC ....... *H03K 3/356165* (2013.01); *H03K 3/012* (2013.01); *H03K 3/356113* (2013.01)

(58) Field of Classification Search
CPC .......... H03K 3/01; H03K 3/012; H03K 3/013; H03K 3/02; H03K 3/027; H03K 3/037; H03K 3/353; H03K 3/356; H03K 3/356104; H03K 3/356113; H03K 3/356147; H03K 3/356165; H03K 3/356182; H03K 19/20
See application file for complete search history.

(56) References Cited

U.S. PATENT DOCUMENTS 7,138,842 B2 * 11/2006 Padhye ................ H03K 3/0375
  327/218
7,301,381 B2 * 11/2007 Rhee .................... H03K 3/0372
  327/212

* cited by examiner

*Primary Examiner* — Long Nguyen
(74) *Attorney, Agent, or Firm* — Fenwick & West LLP

(57) ABSTRACT

A dynamic flip-flop circuit with a feedback loop includes a input tristate circuit configured to receive a data signal and a clock signal to output a tristate output data signal. The dynamic flip-flop circuit also includes a feedforward circuit configured to receive the tristate output data signal as input to output a feedforward output data signal. The dynamic flip-flop circuit also includes a feedback loop circuit configured to connect the output of the feedforward circuit and the output of the input tristate circuit. The feedback loop circuit includes a transmission gate circuit that is partially on.

18 Claims, 8 Drawing Sheets

DYNAMIC POWER EFFICIENT LOW POWER FLIP-FLOP

TECHNICAL FIELD

The present disclosure relates to flip-flop circuit designs, specifically to dynamic low-power flip-flop circuit designs with a feedback loop.

BACKGROUND

Flip-flop circuits are fundamental building blocks of digital electronics and play a crucial role in storing and manipulating binary information. They are widely used in computer memory, sequential logic circuits, and various other applications.

A flip-flop is a circuit element that can store a single bit of information, represented as either a 0 or a 1. It has two stable states, commonly referred to as "0" and "1," which correspond to different voltage levels. The transition between these two states occurs in response to specific input signals.

There is often a tradeoff between frequency range and complexity of flip-flop circuits. The tradeoff arises because increasing the complexity of a flip-flop circuit can potentially improve its frequency range. On the other hand, simpler flip-flops have a lower component count and are easier to design and implement.

Generally, increased transistor count often contributes to higher power consumption. Many techniques, while enhancing performance, may also increase the complexity of the circuit, leading to higher power consumption.

SUMMARY

Embodiments described herein include a dynamic flip-flop circuit with a feedback loop. The flip-flop circuit includes an input tristate circuit configured to receive a data signal and a clock signal to output a tristate output data signal. The flip-flop circuit also includes a feedforward circuit configured to receive the tristate output data signal as input to output a feedforward output data signal. The flip-flop circuit also includes a feedback loop circuit configured to connect the output of the feedforward circuit and the output of the input tristate circuit. The feedback loop circuit includes a transmission gate circuit that is in a partially on state (or partially on) to act as leakage feedback, which allows the input tristate circuit to hold the data for a longer time.

In some embodiments, the transmission gate circuit includes an N-type metal oxide semiconductor (NMOS) transistor and a p-type metal oxide semiconductor (PMOS) transistor. A source of the NMOS transistor and a source of the PMOS transistor are electrically coupled with the output of the feedforward circuit. A drain of the NMOS transistor and a drain of the PMOS transistor are electrically coupled with the output of the input tristate circuit. A gate of the NMOS transistor is electrically coupled with a first static voltage signal, and a gate of the PMOS transistor is electrically coupled with a second static voltage signal, and the first static voltage signal or the second static voltage signal is less than a threshold of the NMOS transistor or the PMOS transistor to cause the NMOS transistor and the PMOS transistor to be only partially on.

Embodiments described herein also include a multi-bit flip-flop circuit (e.g., 8-bit flip-flop circuit) comprising a plurality of the dynamic flip-flop circuits described above. The input tristate circuit of each of the plurality of flip-flop circuits receives a same clock signal. The multi-bit flip-flop circuit includes a single clock signal circuit configured to generate the clock signal for the input tristate circuits of the plurality of flip-flop circuits. The feedback loop circuit of each of the plurality of flip-flop circuits receives a same first static voltage signal and a same second static voltage signal. In some embodiments, the multi-bit flip-flop circuit includes a single static voltage signal circuit configured to generate the first static voltage signal and the second static voltage signal for the feedback loop circuits of the plurality of flip-flop circuits.

Other aspects include components, devices, systems, improvements, methods, processes, applications, computer-readable mediums, and other technologies related to any of the above.

BRIEF DESCRIPTION OF THE DRAWINGS

The disclosure will be understood more fully from the detailed description given below and from the accompanying figures of embodiments of the disclosure. The figures are used to provide knowledge and understanding of embodiments of the disclosure and do not limit the scope of the disclosure to these specific embodiments. Furthermore, the figures are not necessarily drawn to scale.

DETAILED DESCRIPTION

Figure 1:
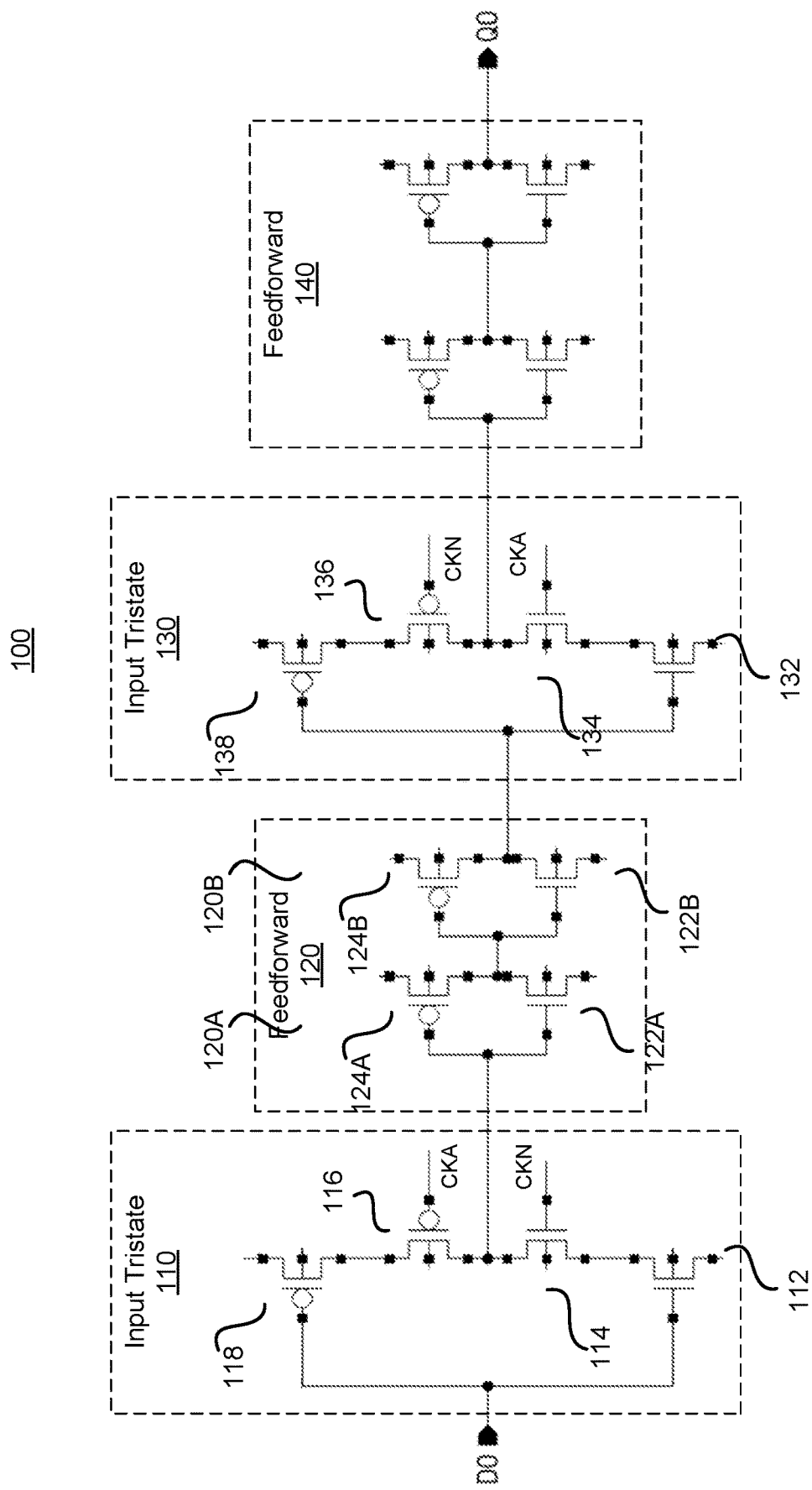
FIG. 1 illustrates an example architecture of a one-bit dynamic flip-flop circuit without a feedback loop in accordance with some embodiments.

Aspects of the present disclosure relate to a dynamic flip-flop circuit with a feedback loop. Flip-flop circuits are fundamental building blocks of digital electronics and play a crucial role in storing and manipulating binary information. They are widely used in computer memory, sequential logic circuits, and various other applications.

There is often a tradeoff between frequency range and complexity of flip-flop circuits. The tradeoff arises because increasing the complexity of a flip-flop circuit can potentially improve its frequency range. On the other hand, simpler flip-flops have a lower component count and are easier to design and implement.

Further, power consumption also is an important consideration in designing a flip-flop circuit. The power consumption can be categorized into two main components: static power and dynamic power. Static power, also known as leakage power, is the power consumed by the flip-flop when it is in a static state, i.e., when there are no transitions occurring. Static power arises due to leakage currents that flow through transistors even when they are not actively switching. These leakage currents are often a result of imperfections in the semiconductor materials and the inherent behavior of transistors. The static power consumption is relatively constant and does not vary significantly with the frequency or activity of the circuit.

Dynamic power is the power consumed by the flip-flop when it is actively transitioning between states. It is directly related to the frequency of operation and the number of state transitions occurring per unit time. Dynamic power consumption arises due to the charging and discharging of capacitances during switching transitions. When the input signals change, the transistors in the flip-flop circuit switch states, causing charge to move between the internal nodes and the power supply rails. This movement of charge results in energy consumption and contributes to dynamic power.

There are two main types of flip-flops: dynamic flip-flops and static flip-flops. A dynamic flip-flop is based on the principle of capacitor charging and discharging. It requires a clock signal, and a typical dynamic flop does not contain any feedback loop. A static flip-flop does not rely on continuous clock signals like dynamic flip-flops. Instead, it uses additional logic gates to create a clock-enable signal, allowing for stable storage of data.

Static flip-flops generally have a higher frequency range compared to dynamic flip-flops. They can achieve a greater speed range of operation. However, static flip-flops are often larger in terms of circuit design and transistor count. They typically require additional circuit elements to implement features like feedback loops. Due to their increased transistor count, static flip-flops may occupy more silicon area compared to dynamic flip-flops.

On the other hand, dynamic flip-flops are optimized for faster operation and smaller areas. They store information using charge stored on internal capacitances and rely on periodic refreshing.

Figure (FIG.) 1 illustrates an example architecture of a one-bit dynamic flip-flop circuit 100 without a feedback loop in accordance with some embodiments. As illustrated in FIG. 1, the dynamic flip-flop circuit 100 includes a first input tristate circuit 110, a feedforward circuit 120, a second input tristate circuit 130, and a second feedforward circuit 140. The first input tristate circuit 110 includes a first NMOS transistor 112, a second NMOS transistor 114, a first PMOS transistor 118, and a second PMOS transistor 116. A gate of the first NMOS transistor 112 and a gate of the first PMOS transistor 118 are electrically coupled with each other to receive a data signal DO. The first input tristate circuit 110 and the first feedforward circuit 120 form a dynamic latch. The second input tristate circuit 130 and the second feedforward circuit 140 form a dynamic latch.

A gate of the second PMOS transistor 116 is configured to receive a first clock signal CKA, and a gate of the second NMOS transistor 114 is configured to receive a second clock signal CKN, where the first clock signal CKA and the second clock signal CKN are same clock signals with opposite phases. When the first clock signal CKA is low, and the second clock signal CKN is high, both the gate of the second NMOS and the gate of the second PMOS are open, and the input tristate circuit 110 functions as an inverter.

The first feedforward circuit 120 includes two inverters 120A and 120B. Each inverter 120A, 120B includes an NMOS transistor 122A/122B and a PMOS transistor 124A/ 124B. The first inverter 120A inverts the output of the input tristate circuit 110, and the second inverter 120B inverts the output of the first inverter 120A. As such, the feedforward circuit 120 repeats the output of the input tristate circuit 110.

The second input tristate circuit 130 has a same architecture as the first input tristate circuit 110. The second feedforward circuit 140 has a same architecture as the first feedforward circuit 120. As illustrated, the second input tristate circuit 130 also has a first NMOS transistor 132, a second NMOS transistor 134, a first PMOS transistor 138 and a second PMOS transistor 136. However, unlike the first input tristate circuit 110, a gate of the second PMOS transistor 136 and a gate of the second NMOS transistor 134 in the second input tristate circuit 130 receive clock signals that are opposite to the clock signals received by the gate of the second PMOS transistor 116 and the gate of the second NMOS transistor 114 in the first input tristate circuit 110. In particular, the gate of the second PMOS transistor 136 receives the second clock signal CKN, and the gate of the second NMOS transistor 134 receives the first clock signal CKA. As such, the data signal stored in the second input tristate circuit 130 is half a clock cycle delayed compared to the data signal stored in the first input tristate circuit 110. The second feedforward circuit 140 repeats the output of the second input tristate circuit 130 to output an output data signal Q0.

Figure 2:
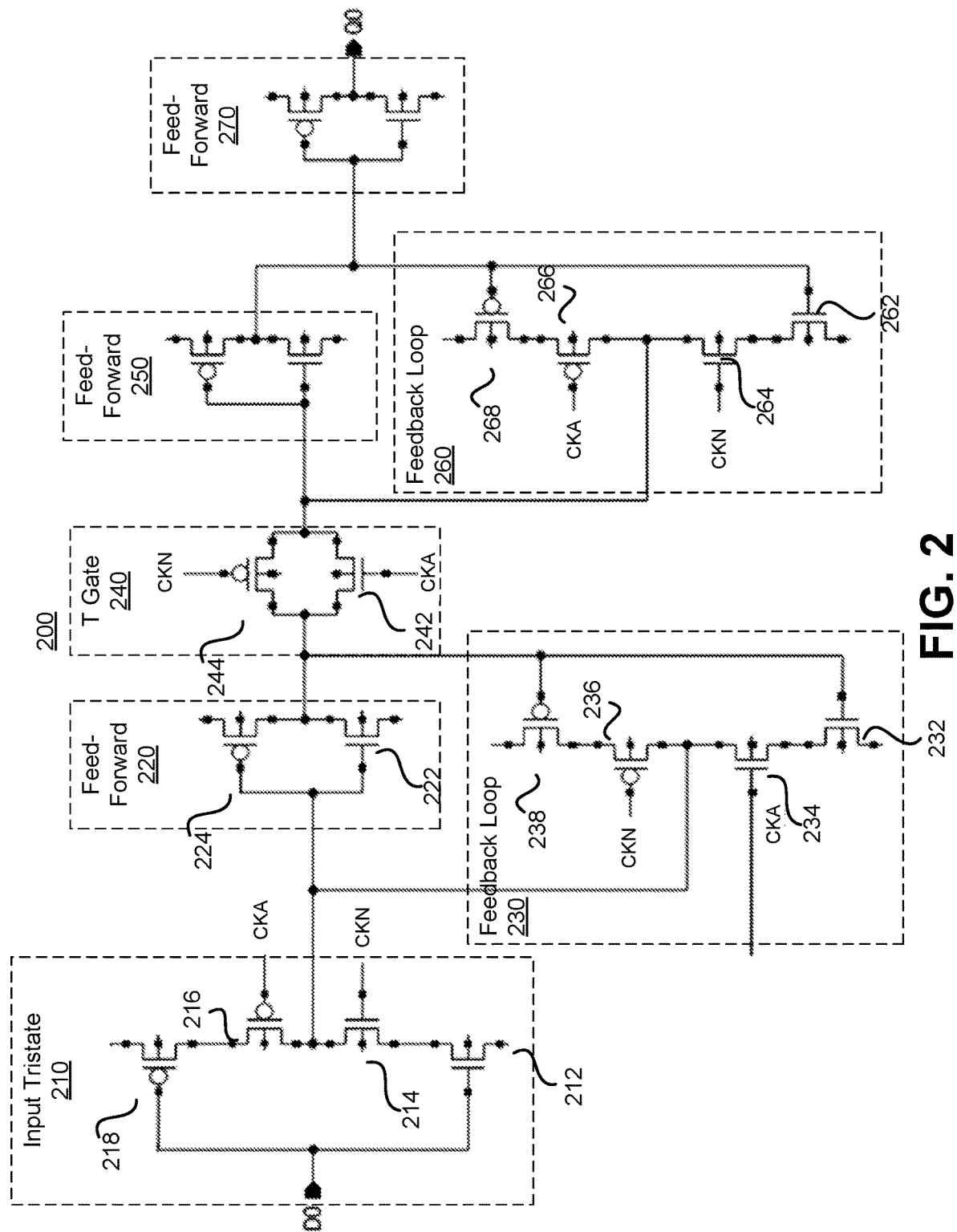
FIG. 2 illustrates an example architecture of a one-bit static flip-flop circuit with a feedback loop in accordance with some embodiments.

FIG. 2 illustrates an example architecture of a one-bit static flip-flop circuit 200 with a feedback loop in accordance with some embodiments. As illustrated, the static flip-flop circuit 200 includes a first input tristate circuit 210, a first feedforward circuit 220, a first feedback loop circuit 230, a transmission gate circuit 240, a second feedforward circuit 250, a second feedback loop circuit 260, and a third feedforward circuit 270.

The first input tristate circuit 210 is similar to the first input tristate circuit 110 in FIG. 1. The first input tristate circuit 210 includes a first NMOS transistor 212, a second NMOS transistor 214, a first PMOS transistor 216, and a second PMOS transistor 218. A gate of the first NMOS transistor 212 and a gate of the first PMOS transistor 218 are electrically coupled with each other to receive a data signal D0. A gate of the second PMOS transistor 216 is configured to receive a first clock signal CKA, and a gate of the second NMOS transistor 214 is configured to receive a second clock signal CKN.

However, unlike feedforward circuit 120 in FIG. 1 (which includes two inverters), the feedforward circuit 220 only includes one inverter having an NMOS transistor 222 and a PMOS transistor 224. The first feedback loop circuit 230 is connected between an output of the feedforward circuit 220 and an output of the input tristate circuit 210. The feedback loop circuit 230 is a input tristate circuit similar to the first input tristate circuit 210. As illustrated, the feedback loop circuit 230 includes a first NMOS transistor 232, a second NMOS transistor 234, a first PMOS transistor 238, and a second PMOS transistor 236. A gate of the first NMOS transistor 232 and agate of the first PMOS transistor 238 are electrically coupled with an output of the first feedforward circuit 220. A gate of the second NMOS transistor 234 receives the first clock signal CKA, and a gate of the second PMOS transistor 236 receives the second clock signal CKN, which are opposite to the clock signals at the gate of the second NMOS transistor 214 and the gate of the second PMOS transistor 216 of the first input tristate circuit 210. As such, when the gates of the input tristate circuit 210 are open, the gates of the feedback loop circuit 230 are closed.

The transmission gate circuit 240 connects the first feedforward circuit 220 and the second feedforward circuit 250. The transmission gate circuit 240 includes an NMOS transistor 242 and a PMOS transistor 244. A gate of the NMOS transistor 242 and a gate of the PMOS transistor 244 are configured to receive clock signals CKA and CKN, which are opposite to the gates of the first input tristate circuit 210. As such, when the first input tristate circuit 210 is closed, the transmission gate circuit 240 and the feedback loop circuit 230 are open.

The second feedforward circuit 250 and the second feedback loop circuit 260 share the same architectures as the first feedforward circuit 220 and the first feedback loop circuit 230. As illustrated, the second feedback loop circuit 260 includes a first NMOS transistor 262, a second NMOS transistor 264, a first PMOS transistor 268, and a second PMOS transistor 266. A gate of the second NMOS transistor 264 receives the second clock signal CKN, and a gate of the second PMOS transistor 266 receives the first clock signal CKA, which are opposite to the clock signals received by the gate of the second NMOS transistor 234 and the second PMOS transistor 236 of the first feedback loop circuit 230. As such, the data signal stored at the second feedforward circuit 250 extends to another half-clock cycle. The third feedforward circuit 270 simply inverts the data received from the second feedforward circuit 250.

Figure 3:
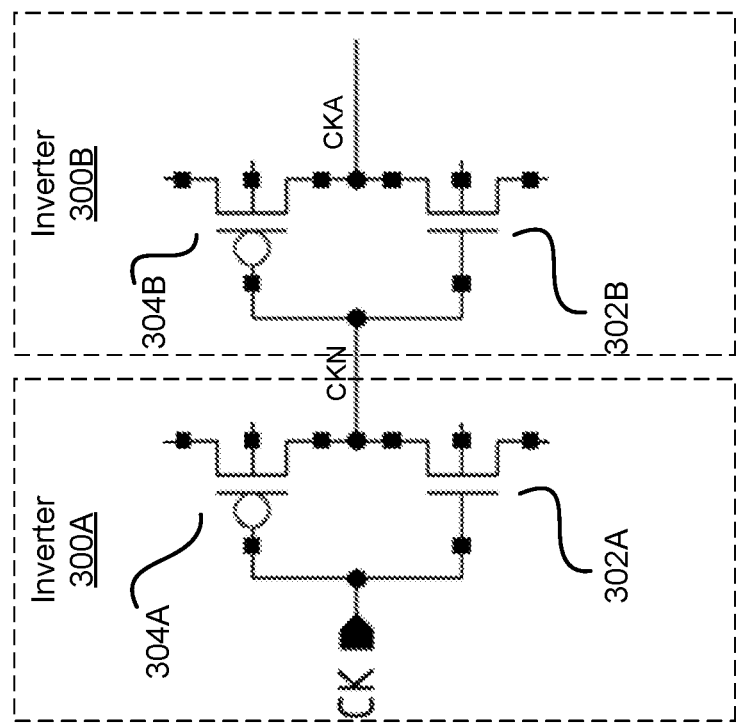
FIG. 3 illustrates an example architecture of a clock circuit in accordance with some embodiments.

FIG. 3 illustrates an example architecture of a clock circuit 300 in accordance with some embodiments. As illustrated in FIG. 3, the clock circuit 300 includes two inverters 300A and 300B. A first inverter 300A (including a PMOS transistor 302A and an NMOS transistor 304A) receives a clock signal CK an input and outputs an inverted clock signal CKN. A second inverter 300B (including a PMOS transistor 302B and an NMOS transistor 304B) receives the inverted clock signal CKN as input and outputs a further inverted clock signal CKA.

The static flip-flop circuit 200 and the dynamic flip-flop circuit 100 each have their own strengths. For example, the static flip-flop circuit 200 results in more dynamic power consumption, but can operate a greater frequency range; while the dynamic flip-flop circuit 100 results in less dynamic power consumption (e.g., about 26% less dynamic power compared to the static flip-flop circuit 200), but can only operate at a higher frequency range. In particular, the dynamic flip-flop circuit 100 doesn't have a feedback structure in each latch to retain the data inside each latch. The data is retained in each latch through the continuous clock triggering. Off-state leakage and leakage from the contexts further reduce the retention capability of the internal latches. As such, the flip-flop circuit 100 cannot operate at a lower frequency, since the internal latches cannot retain the data for a long period of time.

Figure 4:
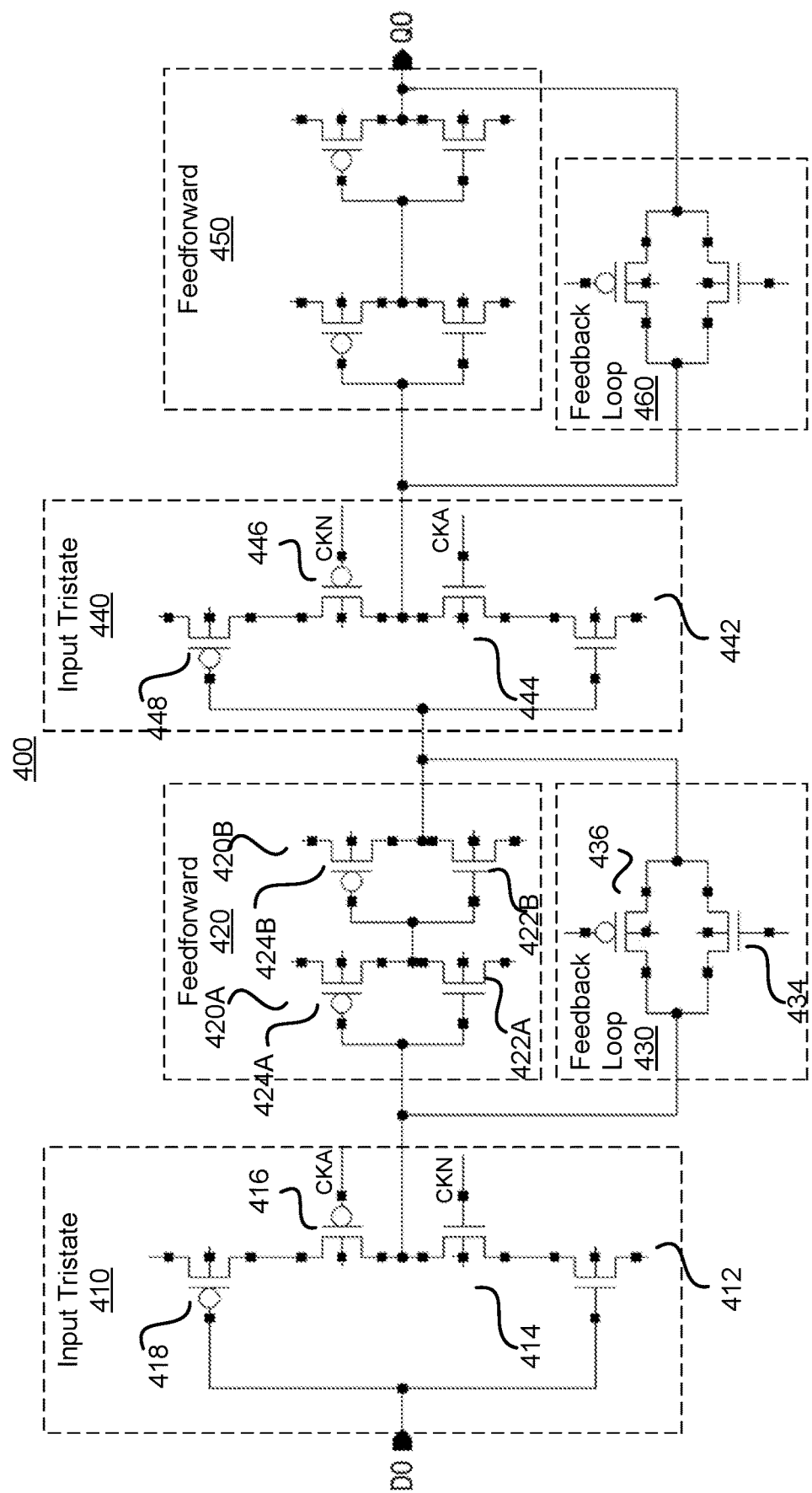
FIG. 4 illustrates an example architecture of a one-bit dynamic flip-flop circuit with a feedback loop in accordance with some embodiments.

Embodiments described herein include an improved dynamic flip-flop circuit with a feedback loop, such that data is retained for a longer period in each latch, while still achieving low dynamic power consumption. FIG. 4 illustrates an example architecture of a one-bit dynamic flip-flop circuit 400 with a feedback loop in accordance with some embodiments.

The dynamic flip-flop circuit 400 includes a first input tristate circuit 410, a first feedforward circuit 420, a first feedback loop circuit 430, a second input tristate circuit 440, a second feedforward circuit 450, and a second feedback loop circuit 460. The first input tristate circuit 410, the first feedforward circuit 420, the second input tristate circuit 440, and the second feedforward circuit 450 are similar to the first input tristate circuit 110, the first feedforward circuit 120, the second input tristate circuit 130, and the second feedforward circuit 140 of the dynamic flip-flop circuit 100 in FIG. 1.

In particular, the first input tristate circuit 410 includes a first NMOS transistor 412, a second NMOS transistor 414, a first PMOS transistor 418, and a second PMOS transistor 416. A gate of the first NMOS transistor 412 and a gate of the second NMOS transistor 414 are electrically coupled with each other to receive an input signal DO. A gate of the second PMOS transistor 416 receives a first clock signal CKA, and a gate of the second NMOS transistor 414 receives a second clock signal CKN.

The first feedforward circuit 420 includes two inverters 420A and 420B. Each inverter 420A/420B includes an NMOS transistor 422A/422B and a PMOS transistor 424A/424B. The second input tristate circuit 440 and the second feedforward circuit 450 share same architectures as the first input tristate circuit 410 and the first feedforward circuit 420, except that the clock signals received by second input tristate circuit 440 are opposite to those of the first input tristate circuit 410. In particular, the second input tristate circuit 440 includes a first NMOS transistor 442, a second NMOS transistor 444, a first PMOS transistor 446, and a second PMOS transistor 448. A gate of the second NMOS transistor 444 receives the first clock signal CKA (which is opposite to the gate of the second NMOS transistor 414 in the first input tristate circuit 410), and a gate of the second PMOS transistor 446 receives the second clock signal CKN (which is opposite to the gate of the second PMOS transistor 416).

However, unlike the dynamic flip-flop circuit 100, the dynamic flip-flop circuit 400 further includes a first feedback loop circuit 430 between an output of the first input tristate circuit 410 and an output of the first feedforward circuit 420, and a second feedback loop circuit 460 between an output of the second input tristate circuit 440 and the second feedforward circuit 450.

Further, the first feedback loop circuit 430 and the second feedback loop circuit 460 are different from the feedback loop circuits 230, 260 in the static flip-flop circuit 200 in FIG. 2. The feedback loop circuits 430, 460 are not controlled by clock signals. Instead, they are merely partially open transmission gates. Thus, the feedback loop circuits 430, 460 are also referred to as dummy feedback. Because the dummy feedback 430, 460 is independent of the switching or clock, they do not have a large impact on the dynamic power consumption.

In particular, the feedback loop circuit 430 includes an NMOS transistor 434 and a PMOS transistor 436. A source of the NMOS transistor 434 and a source of the PMOS transistor 436 are electrically coupled with the output of the feedforward circuit 420. A drain of the NMOS transistor 434 and a drain of the PMOS transistor 436 are electrically coupled with the output of the input tristate circuit 440.

A gate of the NMOS transistor 434 receives a first static voltage signal (denoted as netlow), and a gate of the PMOS transistor 436 receives a second static voltage signal (denoted as nethigh). Note, netlow is not same as a low voltage VSS, nor is nethigh same as a high voltage VDD. In particular, netlow is greater than the low voltage VSS, nethigh is lower than the high voltage VDD, and netlow is lower than nethigh, such that the gate of the NMOS transistor and the gate of the PMOS transistor are partially open, operating in deep subthreshold region, i.e., the NMOS transistor and the PMOS transistor are not on, but having subthreshold leakage to act as leakage feedback. This allows the input tristate circuit 410 or 440 to hold the data for a longer period of time.

The second feedback loop circuit 460 shares a same architecture as the first feedback loop circuit 430. In some embodiments, a same static voltage signal circuit can provide the netlow and nethigh voltage signals to both the first feedback loop circuit 430 and the second feedback loop circuit 460.

Figure 5:
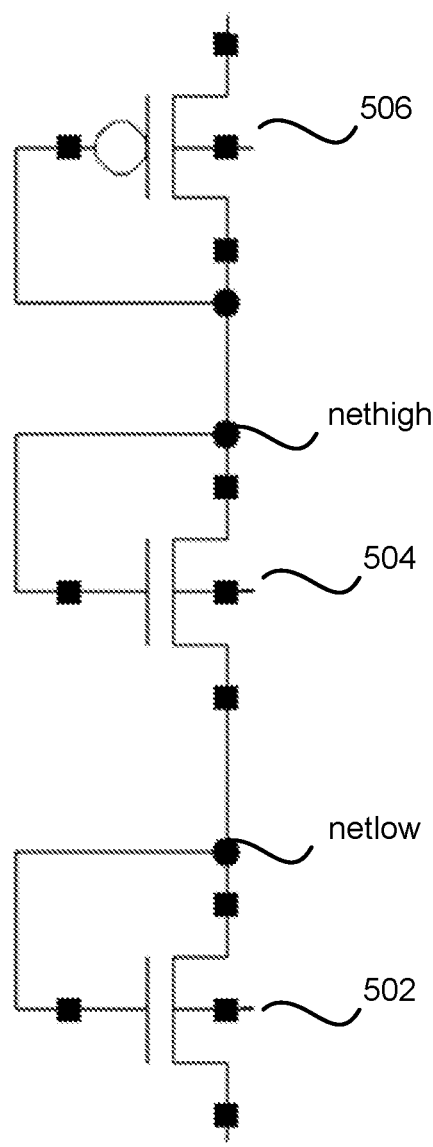
FIG. 5 illustrates an example architecture of a static voltage signal circuit configured to supply two static voltage signals to the feedback loop of the one-bit dynamic flip-flop circuit of FIG. 4 in accordance with some embodiments.

FIG. 5 illustrates an example architecture of a static voltage signal circuit 500 configured to supply two static voltage signals (e.g. netlow and nethigh) to the feedback loop of the one-bit dynamic flip-flop circuit of FIG. 4 in accordance with some embodiments. As illustrated in FIG. 5, the static voltage signal circuit 500 includes two NMOS transistors 502, 504 and a PMOS transistor 506 electrically coupled with each other in serial.

Note, the single-bit flip-flop circuit 400 may be implemented in a multi-bit flip-flop circuit, e.g., 8-bit flip-flop circuit. The multi-bit flip-flop circuit may include multiple single-bit flip-flop circuit 400. Since the multiple single-bit flip-flop circuit 400 can share same clock signals (CKA, CKN) and static voltage signals (netlow, nethigh), only one clock signal circuit 300 and one static voltage signal circuit 500 may be shared by the multiple single-bit flip-flop circuits 400.

Figure 6:
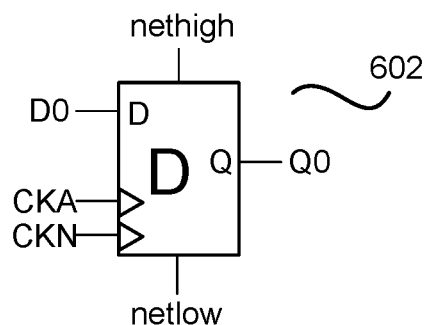
FIG. 6 illustrates an example architecture of an 8-bit flip-flop circuit in accordance with some embodiments.
Figure 6:
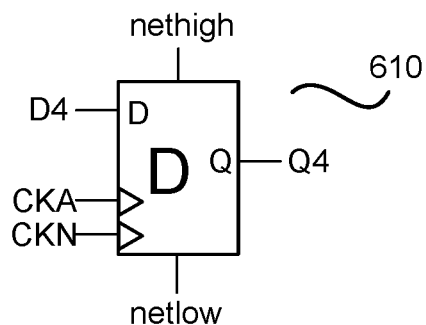
Figure 6:
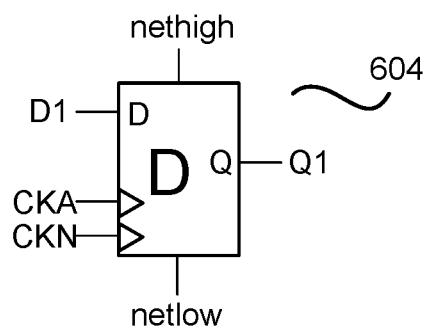
Figure 6:
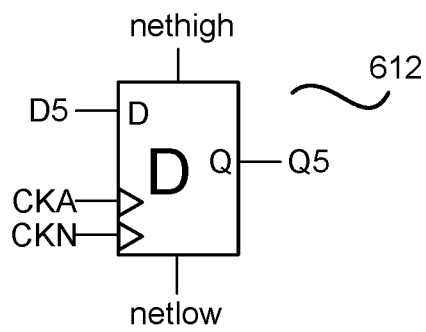
Figure 6:
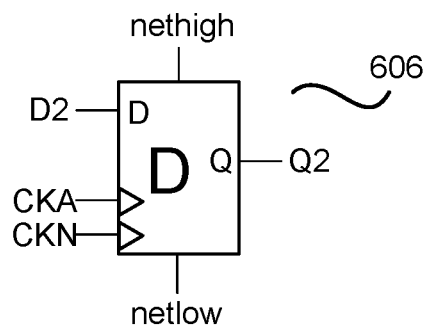
Figure 6:
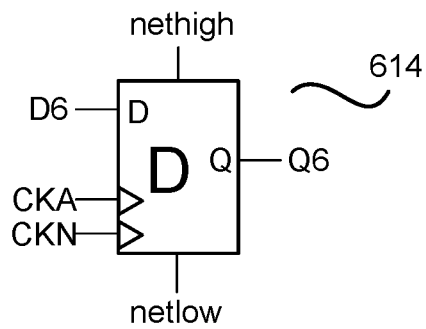
Figure 6:
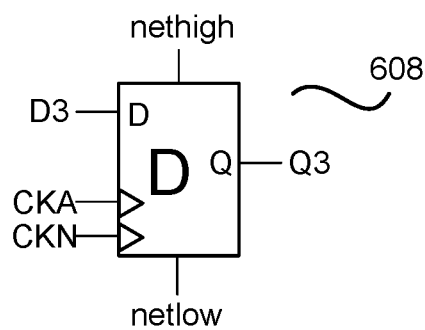
Figure 6:
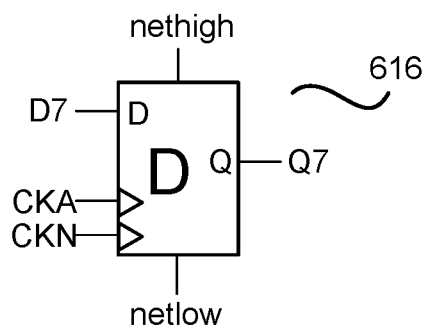

FIG. 6 illustrates an example architecture of an 8-bit flip-flop circuit 600 in accordance with some embodiments. The 8-bit flip-flop circuit 600 includes eight single-bit flip-flop circuits 602, 604, 606, 608, 610, 612, 614, 616, each of which may correspond to the dynamic flip-flop circuit 400 of FIG. 4. Each of the single-bit flip-flop circuits receives a first clock signal CKA, a second clock signal CKN, a first static voltage signal (netlow), and a second static voltage signal (nethigh).

Experiments show that an 8-bit flip-flop circuit 600 based on the dynamic flip-flop circuit 400 with a feedback loop can operate at a frequency range greater than the dynamic flip-flop circuit 100. In particular, the frequency range of the dynamic flip-flop circuit 400 expands from a much lower frequency to a much higher frequency than the dynamic flip-flop circuit 100. In some embodiments, the low frequency of the dynamic flip-flop circuit 400 is about a quarter of the low frequency of the dynamic flip-flop circuit 100; and the high frequency of the dynamic flip-flop circuit 400 is about 20% higher than the high frequency of the dynamic flip-flop circuit 400. Further, the 8-bit flip-flop circuit 600 based on the dynamic flip-flop circuit 400 also reduces dynamic power consumption by 23% compared to an 8-bit flip-flop circuit based on the static flip-flop circuit 200, which is also a significant improvement compared to the static flip-flop circuit 200.

Figure 7:
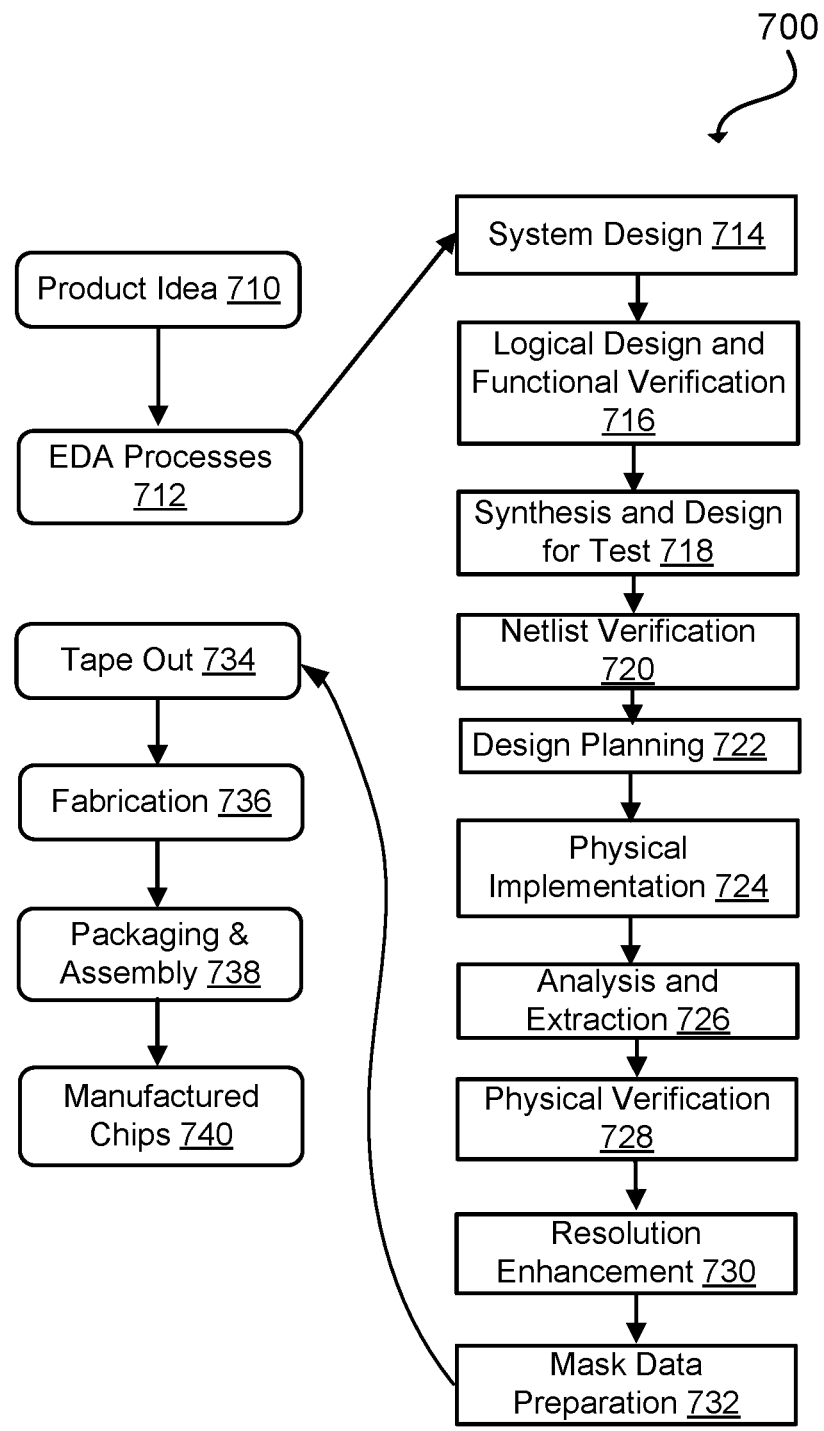
FIG. 7 depicts a flowchart of various processes used during the design and manufacture of an integrated circuit in accordance with some embodiments.

FIG. 7 illustrates an example set of processes 700 used during the design, verification, and fabrication of an article of manufacture such as an integrated circuit, including the circuit configuration as described in FIGS. 1-6, to transform and verify design data and instructions that represent the integrated circuit. Each of these processes can be structured and enabled as multiple modules or operations. The term 'EDA' signifies the term 'Electronic Design Automation.' These processes start with the creation of a product idea 710 with information supplied by a designer, information which is transformed to create an article of manufacture that uses a set of EDA processes 712. When the design is finalized, the design is taped-out 734, which is when artwork (e.g., geometric patterns) for the integrated circuit is sent to a fabrication facility to manufacture the mask set, which is then used to manufacture the integrated circuit. After tape-out, a semiconductor die is fabricated 736 and packaging and assembly processes 738 are performed to produce the finished integrated circuit 740.

Specifications for a circuit or electronic structure may range from low-level transistor material layouts to high-level description languages. A high-level of representation may be used to design circuits and systems, using a hardware description language ('HDL') such as VHDL, Verilog, SystemVerilog, SystemC, MyHDL or OpenVera. The HDL description can be transformed to a logic-level register transfer level ('RTL') description, a gate-level description, a layout-level description, or a mask-level description. Each lower representation level that is a more detailed description adds more useful detail into the design description, for example, more details for the modules that include the description. The lower levels of representation that are more detailed descriptions can be generated by a computer, derived from a design library, or created by another design automation process. An example of a specification language at a lower level of representation language for specifying more detailed descriptions is SPICE, which is used for detailed descriptions of circuits with many analog components. Descriptions at each level of representation are enabled for use by the corresponding tools of that layer (e.g., a formal verification tool). A design process may use a sequence depicted in FIG. 7. The processes described by be enabled by EDA products (or tools).

During system design 714, functionality of an integrated circuit to be manufactured is specified. The design may be optimized for desired characteristics such as power consumption, performance, area (physical and/or lines of code), and reduction of costs, etc. Partitioning of the design into different types of modules or components can occur at this stage.

During logic design and functional verification 716, modules or components in the circuit are specified in one or more description languages and the specification is checked for functional accuracy. For example, the components of the circuit may be verified to generate outputs that match the requirements of the specification of the circuit or system being designed. Functional verification may use simulators and other programs such as testbench generators, static HDL checkers, and formal verifiers. In some embodiments, special systems of components referred to as 'emulators' or 'prototyping systems' are used to speed up the functional verification.

During synthesis and design for test 718, HDL code is transformed to a netlist. In some embodiments, a netlist may be a graph structure where edges of the graph structure represent components of a circuit and where the nodes of the graph structure represent how the components are interconnected. Both the HDL code and the netlist are hierarchical articles of manufacture that can be used by an EDA product to verify that the integrated circuit, when manufactured, performs according to the specified design. The netlist can be optimized for a target semiconductor manufacturing technology. Additionally, the finished integrated circuit may be tested to verify that the integrated circuit satisfies the requirements of the specification.

During netlist verification 720, the netlist is checked for compliance with timing constraints and for correspondence with the HDL code. During design planning 722, an overall floor plan for the integrated circuit is constructed and analyzed for timing and top-level routing.

During layout or physical implementation 724, physical placement (positioning of circuit components such as transistors or capacitors) and routing (connection of the circuit components by multiple conductors) occurs, and the selection of cells from a library to enable specific logic functions can be performed. As used herein, the term 'cell' may specify a set of transistors, other components, and interconnections that provides a Boolean logic function (e.g., AND, OR, NOT, XOR) or a storage function (such as a flip-flop or latch). As used herein, a circuit 'block' may refer to two or more cells. Both a cell and a circuit block can be referred to as a module or component and are enabled as both physical structures and in simulations. Parameters are specified for selected cells (based on 'standard cells') such as size and made accessible in a database for use by EDA products.

During analysis and extraction 726, the circuit function is verified at the layout level, which permits refinement of the layout design. During physical verification 728, the layout design is checked to ensure that manufacturing constraints are correct, such as DRC constraints, electrical constraints, lithographic constraints, and that circuitry function matches the HDL design specification. During resolution enhancement 730, the geometry of the layout is transformed to improve how the circuit design is manufactured.

During tape-out, data is created to be used (after lithographic enhancements are applied if appropriate) for production of lithography masks. During mask data preparation 732, the 'tape-out' data is used to produce lithography masks that are used to produce finished integrated circuits.

A storage subsystem of a computer system (such as computer system 800 of FIG. 8) may be used to store the programs and data structures that are used by some or all of the EDA products described herein, and products used for development of cells for the library and for physical and logical design that use the library.

Figure 8:
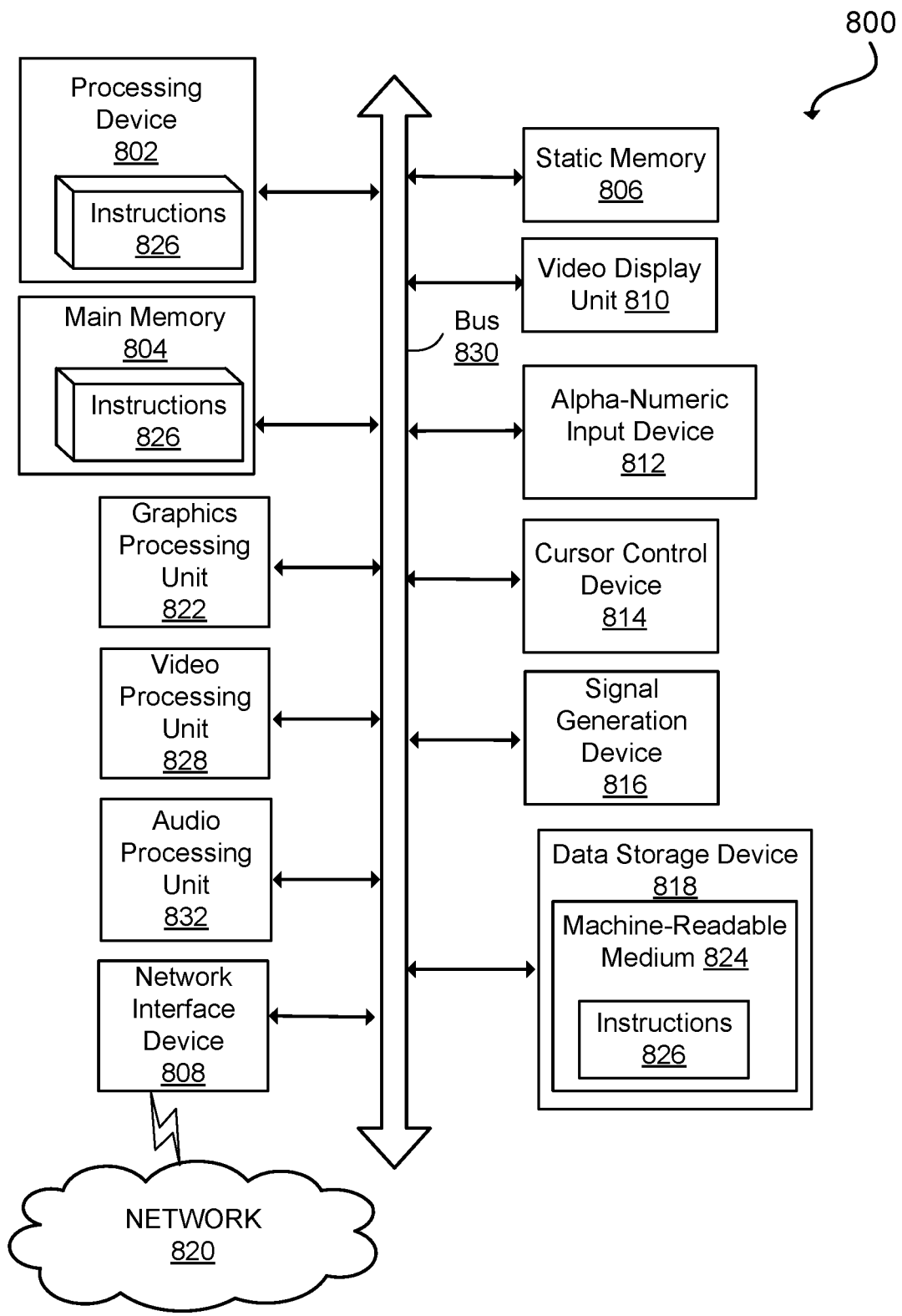
FIG. 8 depicts a diagram of an example computer system in which embodiments of the present disclosure may operate.

FIG. 8 illustrates an example machine of a computer system 800 within which a set of instructions, for causing the machine to perform any one or more of the methodologies discussed herein, may be executed. In alternative implementations, the machine may be connected (e.g., networked) to other machines in a LAN, an intranet, an extranet, and/or the Internet. The machine may operate in the capacity of a server or a client machine in client-server network environment, as a peer machine in a peer-to-peer (or distributed) network environment, or as a server or a client machine in a cloud computing infrastructure or environment.

The machine may be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 800 includes a processing device 802, a main memory 804 (e.g., read-only memory (ROM), flash memory, dynamic random access memory (DRAM) such as synchronous DRAM (SDRAM), a static memory 806 (e.g., flash memory, static random access memory (SRAM), etc.), and a data storage device 818, which communicate with each other via a bus 830.

Processing device 802 represents one or more processors such as a microprocessor, a central processing unit, or the like. More particularly, the processing device may be complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 802 may also be one or more special-purpose processing devices such as an application specific integrated circuit (ASIC), a field programmable gate array (FPGA), a digital signal processor (DSP), network processor, or the like. The processing device 802 may be configured to execute instructions 826 for performing the operations and steps described herein.

The computer system 800 may further include a network interface device 808 to communicate over the network 820. The computer system 800 also may include a video display unit 810 (e.g., a liquid crystal display (LCD) or a cathode ray tube (CRT)), an alphanumeric input device 812 (e.g., a keyboard), a cursor control device 814 (e.g., a mouse), a graphics processing unit 822, a signal generation device 816 (e.g., a speaker), graphics processing unit 822, video processing unit 828, and audio processing unit 832.

The data storage device 818 may include a machine-readable storage medium 824 (also known as a non-transitory computer-readable medium) on which is stored one or more sets of instructions 826 or software embodying any one or more of the methodologies or functions described herein. The instructions 826 may also reside, completely or at least partially, within the main memory 804 and/or within the processing device 802 during execution thereof by the computer system 800, the main memory 804 and the processing device 802 also constituting machine-readable storage media.

In some implementations, the instructions 826 include instructions to implement functionality corresponding to the present disclosure. While the machine-readable storage medium 824 is shown in an example implementation to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine and the processing device 802 to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm may be a sequence of operations leading to a desired result. The operations are those requiring physical manipulations of physical quantities. Such quantities may take the form of electrical or magnetic signals capable of being stored, combined, compared, and otherwise manipulated. Such signals may be referred to as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the present disclosure, it is appreciated that throughout the description, certain terms refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may include a computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various other systems may be used with programs in accordance with the teachings herein, or it may prove convenient to construct a more specialized apparatus to perform the method. In addition, the present disclosure is not described with reference to any particular programming language. It will be appreciated that a variety of programming languages may be used to implement the teachings of the disclosure as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing disclosure, implementations of the disclosure have been described with reference to specific example implementations thereof. It will be evident that various modifications may be made thereto without departing from the broader spirit and scope of implementations of the disclosure as set forth in the following claims. Where the disclosure refers to some elements in the singular tense, more than one element can be depicted in the figures and like elements are labeled with like numerals. The disclosure and drawings are, accordingly, to be regarded in an illustrative sense rather than a restrictive sense.

What is claimed is:

1. A flip-flop circuit comprising:
    an input tristate circuit configured to receive a data signal and a clock signal to output a tristate output data signal;
    a feedforward circuit configured to receive the tristate output data signal as input to output a feedforward output data signal; and
    a feedback loop circuit configured to connect output of the feedforward circuit and output of the input tristate circuit, wherein the feedback loop circuit includes a transmission gate circuit that is in a partially on state, wherein the transmission gate circuit includes an NMOS transistor and a PMOS transistor,
    a source of the NMOS transistor and a source of the PMOS transistor are electrically coupled with the output of the feedforward circuit,
    a drain of the NMOS transistor and a drain of the PMOS transistor are electrically coupled with the output of the input tristate circuit,
    a gate of the NMOS transistor receives at an input a first static voltage signal, and
    a gate of the PMOS transistor receives at an input a second static voltage signal, the first static voltage signal or the second static voltage signal is greater than 0, but lower than a threshold voltage of the NMOS transistor or a threshold voltage of the PMOS transistor to cause the gate of the NMOS transistor or the gate of the PMOS transistor to be in the partially on state.

2. The flip-flop circuit of claim 1, wherein the first static voltage signal is in a range between ¼ and ⅓ of the threshold voltage of the NMOS transistor or the threshold voltage of the PMOS transistor, and the second static voltage signal is in a range between ⅔ and ¾ of the threshold voltage of the NMOS transistor or the threshold voltage of the PMOS transistor.

3. The flip-flop circuit of claim 1, further comprising a static voltage signal circuit, wherein the static voltage signal circuit comprises first NMOS transistor, a second NMOS transistor, and a PMOS transistor, the first NMOS transistor and the second NMOS transistor electrically coupled with the PMOS transistor in serial and configured to generate the first static voltage signal and the second static voltage signal.

4. The flip-flop circuit of claim 1, wherein the input tristate circuit comprises:
    a first NMOS transistor, a drain of the first NMOS transistor is electrically coupled with a low voltage;
    a second NMOS transistor, a drain of the second NMOS transistor is electrically coupled with a source of the first NMOS transistor;
    a first PMOS transistor, a drain of the first PMOS transistor is electrically coupled with a high voltage;
    a second PMOS transistor, a drain of the second PMOS transistor is electrically coupled with a source of the first PMOS transistor;
    wherein a gate of the first NMOS transistor and a gate of the first PMOS transistor are electrically coupled with receive the data signal; and
    wherein a gate of the second PMOS transistor is configured to receive the clock signal, and a gate of the second NMOS transistor is configured to receive a second clock signal that is opposite to the clock signal.

5. The flip-flop circuit of claim 1, wherein the feedforward circuit includes at least one inverter circuit configured to receive the output of the input tristate circuit as input to invert the output of the input tristate circuit.

6. The flip-flop circuit of claim 5, wherein the feedforward circuit includes a plurality of inverters electrically coupled with each other in serial, each of the plurality of inverters configured to invert a received signal.

7. The flip-flop circuit of claim 1, wherein the input tristate circuit is a first input tristate circuit, the feedforward circuit is a first feedforward circuit, and the feedback loop circuit is a first feedback loop circuit, and the flip-flop circuit further comprises:
    a second input tristate circuit configured to receive the output of the feedforward circuit to output a second tristate output signal;
    a second feedforward circuit configured to receive the second tristate output signal to output a second feedforward output signal; and a second feedback loop circuit configured to connect the
output of the second feedforward circuit and the output
of the second input tristate circuit, wherein the second
feedback loop circuit includes a second transmission
gate circuit that is in a partially on state.

8. The flip-flop circuit of claim 7, wherein the first input tristate circuit and the second input tristate circuit have same architecture, the first feedforward circuit and the second feedforward circuit have same architecture, and the first feedback loop circuit and the second feedback loop circuit have same architecture.

9. The flip-flop circuit of claim 3, wherein the input tristate circuit, the feedforward circuit and the feedback loop circuit form a single-bit flip-flop circuit,
wherein the flip-flop circuit further comprises a plurality of the single-bit flip-flop circuits to form a multi-bit flip-flop circuit.

10. The flip-flop circuit of claim 9, further comprising a clock signal circuit configured to generate the clock signal for the input tristate circuits of the plurality of the single-bit flip-flop circuits.

11. The flip-flop circuit of claim 9, wherein the first static voltage signal and the second static voltage signal generated by the static voltage signal circuit are shared by the feedback loop circuits of the plurality of the single-bit flip-flop circuits.

12. The flip-flop circuit of claim 9, wherein the multi-bit flip-flop circuit is an 8-bit flip-flop, comprising eight of the single-bit flip-flop circuits.

13. A system comprising:
a memory storing instructions; and
one or more processors, coupled with the memory and to execute the instructions, the instructions when executed cause the one or more processors to simulate a flip-flop circuit, the flip-flop circuit comprising:
an input tristate circuit configured to receive a data signal and a clock signal to output a tristate output data signal;
a feedforward circuit configured to receive the tristate output data signal as input to output a feedforward output data signal; and
a feedback loop circuit configured to connect output of the feedforward circuit and output of the input tristate circuit, wherein the feedback loop circuit includes a transmission gate circuit that is in a partially on state,
wherein the transmission gate circuit includes an NMOS transistor and a PMOS transistor,
a source of the NMOS transistor and a source of the PMOS transistor are electrically coupled with the output of the feedforward circuit,
a drain of the NMOS transistor and a drain of the PMOS transistor are electrically coupled with the output of the input tristate circuit,
a gate of the NMOS transistor receives at an input a first static voltage signal, and
a gate of the PMOS transistor receives at an input a second static voltage signal, the first static voltage signal or the second static voltage signal is greater than 0, but lower than a threshold voltage of the NMOS transistor or a threshold voltage of the PMOS transistor to cause the gate of the NMOS transistor or the gate of the PMOS transistor to be in the partially on state.

14. The system of claim 13, wherein the first static voltage signal is in a range between ¼ and ⅓ of the threshold voltage of the NMOS transistor or the threshold voltage of the PMOS transistor, and the second static voltage signal is in a range between ⅔ and ¾ of the threshold voltage of the NMOS transistor or the threshold voltage of the PMOS transistor.

15. The system of claim 14, wherein the memory stores additional instructions, when executed by the processor, causing the processor to further simulate a static voltage signal circuit, the static voltage signal circuit comprising two NMOS transistors and a PMOS transistor electrically coupled with each other in serial, the static voltage signal circuit configured to generate the first static voltage signal and the second static voltage signal.

16. The system of claim 15, wherein the input tristate circuit, the feedforward circuit and the feedback loop circuit form a single-bit flip-flop circuit,
wherein the flip-flop circuit further comprises a plurality of the single-bit flip-flop circuits to form a multi-bit flip-flop circuit wherein the memory stores the additional instructions, when executed cause the processor to simulate the multi-bit flip-flop circuit, the multi-bit flip-flop circuit comprising:
the plurality of the single-bit flip-flop circuits;
the clock signal circuit configured to generate clock signals shared by the plurality of the single-bit flip-flop circuits; and
the static voltage signal circuit configured to generate the first static voltage signal and the second static signal shared by the plurality of the single-bit flip-flop circuits.

17. A non-transitory computer-readable medium comprising stored instructions, which when executed by one or more processors, causes the one or more processors to simulate a flip-flop circuit, the flip-flop circuit comprising a single-bit flip-flop circuit, the single-bit flip-flop circuit comprising:
an input tristate circuit configured to receive a data signal and a clock signal to output a tristate output data signal;
a feedforward circuit configured to receive the tristate output data signal as input to output a feedforward output data signal; and
a feedback loop circuit configured to connect output of the feedforward circuit and output of the input tristate circuit, wherein the feedback loop circuit includes a transmission gate circuit that is partially on by a first static signal and a second static signal,
wherein the transmission gate circuit includes an NMOS transistor and a PMOS transistor,
a source of the NMOS transistor and a source of the PMOS transistor are electrically coupled with the output of the feedforward circuit,
a drain of the NMOS transistor and a drain of the PMOS transistor are electrically coupled with the output of the input tristate circuit,
a gate of the NMOS transistor receives at an input the first static signal, and
a gate of the PMOS transistor receives at an input the second static signal, the first static signal or the second static signal is greater than 0, but lower than a threshold voltage of the NMOS transistor or a threshold voltage of the PMOS transistor to cause the gate of the NMOS transistor or the gate of the PMOS transistor to be in the partially on state.

18. The non-transitory computer-readable medium of claim 17, wherein the input tristate circuit, the feedforward circuit and the feedback loop circuit form a single-bit flip-flop circuit, wherein the flip-flop circuit further comprises a plurality of the single-bit flip-flop circuits to form a multi-bit flip-flop circuit, and wherein the non-transitory computer-readable medium further comprises stored instructions, which when executed by a processor, cause the processor to simulate the multi bit flip-flop circuit, the multi-bit flip-flop circuit circuit comprising:

the plurality of the single-bit flip-flop circuits;

a clock signal circuit configured to generate the clock signal shared by the plurality of the single-bit flip-flop circuits; and a static voltage signal circuit configured to generate the first static signal and the second static signal shared by the plurality of the single-bit flip-flop circuits.

* * * * *